March 5, 1963

W. H. BIXBY ET AL

CURRENT SUPPLY APPARATUS

Filed April 18, 1960

3,080,516

INVENTORS: W. H. BIXBY
L. J. GREEN

BY G. F. Heuerman

ATTORNEY

United States Patent Office 3,080,516

Patented Mar. 5, 1963

3,080,516

CURRENT SUPPLY APPARATUS

William H. Bixby and Lowell J. Green, Columbus, Ohio, assignors, by mesne assignments, to North Electric Company, Galion, Ohio, a corporation of Ohio Filed Apr. 18, 1960, Ser. No. 23,008
10 Claims. (Cl. 323—22)

Figure 1:
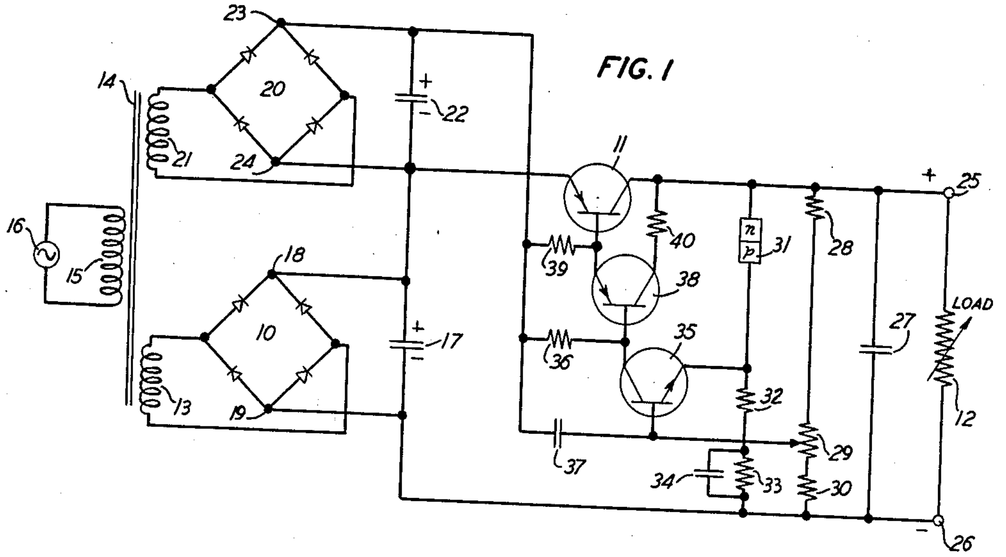

This invention relates to current supply apparatus and more particularly to current supply apparatus employing a series transistor type voltage regulator.

An object of the invention is to provide an improved voltage regulated current supply apparatus.

Another object is to provide an improved series transistor regulated current supply circuit having means for preventing damage to the series transistor.

In a specific embodiment of the invention, herein shown and described for the purpose of illustration, current is supplied from a direct-current supply source through the emitter-collector path of a transistor to a load. There is provided across the load a shunt current path comprising a p-n junction diode in series with resistance, the diode being poled so that, during normal operation, current flows through it in the reverse direction, that is, so that current flows into the n region and out of the p region. Under this condition, the voltage across the diode is substantially constant over a wide range of current through the diode. A control voltage equal to the constant reference voltage across the diode minus a portion of the load voltage is impressed upon the input of a transistor amplifier which controls the emitter-base current of the series transistor and, therefore, the resistance of the emitter-collector path of the series transistor.

Under a normal operating condition a small decrease of load voltage, for example, will cause an increase of the control voltage with the result that the resistance of the emitter-collector path of the series transistor will decrease. The resulting reduction of voltage drop across the emitter-collector path of the series transistor will cause the reduction of load voltage to be minimized. There is provided across a portion at least of the resistance which is in series with the p-n junction diode a condenser which becomes charged by current flowing through the diode. If the load should suddenly increase due to an accidental short circuit across the load terminals, for example, the resulting condenser discharge current flowing through the p-n junction diode in the forward direction will cause the voltage across the diode to be reduced at a faster rate than the rate of reduction of the voltage across the load terminals. Therefore, under this abnormal condition, the control voltage will decrease from a voltage of one polarity through zero to a voltage of opposite polarity to cause the resistance of the emitter-collector path of the series transistor to increase, thereby reducing or substantially interrupting the current flowing through the emitter-collector path of the transistor. Damage to the transistor due to excessive current flow therethrough is thus prevented.

The successful operation of the regulator described above is dependent upon the availability of transistors capable of absorbing the voltage of the current supply source without entering the avalanche breakdown region of operation. With presently available transistors, the circuit could be used to supply a normal load voltage of forty volts, for example. A modified embodiment of the invention, herein specifically shown and described, is suitable for supplying higher voltages to the load without causing damage to the transistors. In this embodiment, there are provided a first and a second voltage source, the negative terminal of the first source being conductively connected to the positive terminal of the second source to provide a common terminal. When using a series transistor of the p-n-p type, for example, current is supplied through a circuit from the positive terminal of the first source, into the emitter and out of the collector of the series transistor to the positive load terminal and from the negative load terminal through a fuse or circuit breaker to the negative terminal of the second source. Current is also supplied through a circuit from the positive terminal of the second source, through a rectifying element in its forward or low resistance direction to the positive load terminal and from the negative load terminal through the fuse to the negative terminal of the second source. The voltage of the first source is limited to a safe value for the series transistor, say thirty volts, while the voltage of the second source will be substantially equal to the maximum voltage required to be supplied to the load minus the voltage of the first source. In this embodiment of the invention, the rectifying element limits the voltage across the emitter-collector path of the series transistor to the voltage of the first source.

Figure 2:
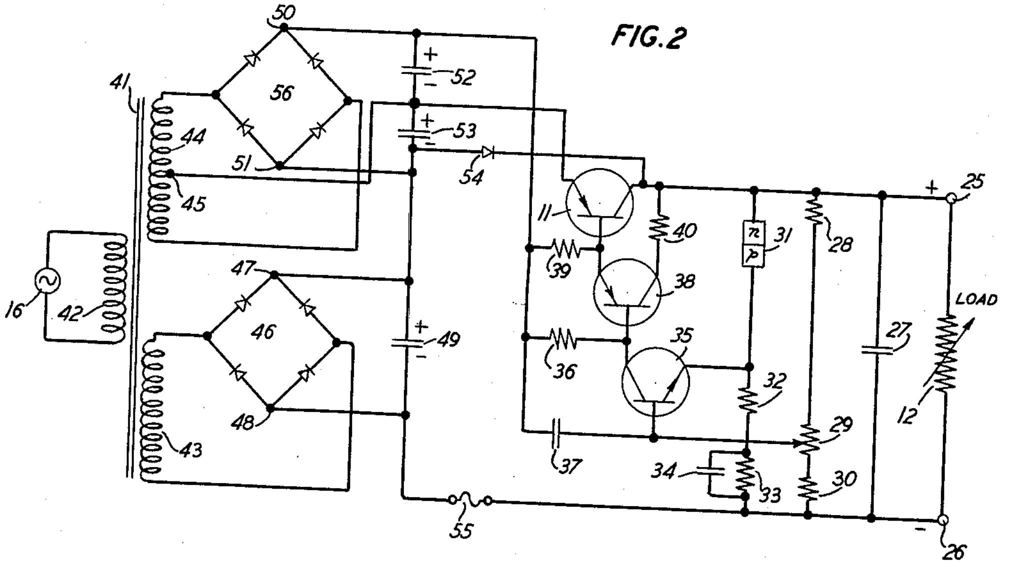

The invention will now be described in greater detail with reference to the accompanying drawing in which:

FIG. 1 is a schematic view of a current supply circuit embodying the invention; and FIG. 2 is a schematic view of a modification of the current supply circuit shown in FIG. 1.

Referring now to FIG. 1 of the drawing, there is provided a circuit for supplying direct current from the output of a bridge rectifier 10 through the emitter-collector path of a series p-n-p type transistor 11 to a load 12 which may vary. The rectifier 10 is energized by current supplied to its input terminals from the secondary winding 13 of a transformer 14 having a primary winding 15 connected to an alternating-current supply source 16. A condenser 17 is connected across the positive and negative output terminals 18 and 19, respectively, of rectifier 10. There is provided a second rectifier 20 having its input terminals connected to a secondary winding 21 of transformer 14 and having a condenser 22 connected across its positive and negative output terminals 23 and 23, respectively. The negative terminal 24 of rectifier 20 and the positive terminal 18 of rectifier 10 are conductively connected to a common terminal which is connected to the emitter of transistor 11. The positive load terminal 25 is connected to the collector of transistor 11 and the negative load terminal 26 is connected to the negative terminal 19 of rectifier 10.

Three shunt paths are connected across the load 12. One of the shunt paths comprises a condenser 27. A second of the shunt paths comprises a resistor 28, a potentiometer 29 and a resistor 30, all in series. The third shunt path comprises a p-n junction diode 31, a resistor 32 and a resistor 33, all in series, and a condenser 34 connected across the resistor 33. The diode 31 is poled so that normally current flows through it in the reverse direction, that is, current flows from the positive load terminal 25 into the n region of the diode and out of the p region. As a result, there is set up across the diode 31 a reference voltage which is substantially constant over a wide range of current flowing through the diode.

The emitter of an n-p-n type transistor 35 is connected to the common terminal of the diode 31 and the resistor 32 and the base of transistor 35 is connected to the adjustable tap of potentiometer 29. The collector of transistor 35 is conected through a resistor 36 to the positive terminal 23 of rectifier 20. A condenser 37 is provided in a path connecting the base of transistor 35 to rectifier terminal 23. The collector of transistor 35 is conected to the base of a p-n-p type transistor 38. The emitter of transistor 38 is connected directly to the base of transistor 11 and also through a resistor 39 to the positive terminal 23 of rectifier 20. The collector of transistor 38 is conected through a resistor 40 to the positive load terminal 25.

The circuit operates to normally maintain across the load 12 a substantially constant voltage which may be changed by varying the setting of the adjustable tap of potentiometer 29. During normal operation, the constant reference voltage across the diode 31 is larger than the portion of the load voltage measured between the positive load terminal 25 and the tap of potentiometer 29. Therefore, current will flow from the positive load terminal 25 through resistor 28 and a portion of potentiometer 29, into the base and out of the emitter of transistor 35 and through resistors 32 and 33 to the negative load terminal, the condenser 34 becoming charged to the voltage drop across resistor 33. A small decrease of load voltage, for example, will cause the base emitter current of transistor 35 to increase, thereby causing an increase of the collector-emitter current and an increase of the voltage drop across resistor 36. The emitter of transistor 38 thus becomes relatively more positive with respect to its base to cause increased current to flow into the emitter and out of the base and collector electrodes of transistor 38. The increased current flow through resistor 39 makes the emitter of series transistor 11 relatively more positive with respect to its base to cause increased current to flow into the emitter of transistor 11 and out of its base and collector electrodes. That is, the resistance of the emitter-collector path of transistor 11 and, therefore, the voltage drop across the emitter-collector path are decreased, thereby minimizing the initially assumed decrease of load voltage.

If the resistance across the load terminals 25 and 26 should suddenly decrease, due to an accidental short circuit, for example, condenser 27 will discharge into the short circuit across the load terminals and condenser 34 will discharge through a circuit comprising resistor 32, diode 31 in the forward direction and through the short circuit across the load terminals. As a result, the voltage across the diode 31 will decrease at a faster rate than the rate of reduction of the load voltage, thereby reducing the base-emitter current and the emitter-collector current in each of transistors 35, 38 and 11. That is, the resistance of the emitter-collector path of transistor 11 is increased to substantially interrupt the current flow through the transistor and to cause the voltage across its emitter-collector path to increase substantially to the output voltage of rectifier 10. The circuit thus functions to protect the transistor 11 from damage due to abnormally high current through the transistor. The transistor 11 is also subject to damage when the voltage across its emitter-collector path exceeds a predetermined limit. To avoid such damage, the maximum required load voltage should not exceed the maximum safe voltage across the emitter-collector path of the transistor.

Where the maximum load voltage required is larger than the maximum safe voltage which may appear across the emitter-collector path of the transistor, the embodiment of the invention shown in FIG. 2 will afford protection for the transistor against both excessive current and excessive voltage. In some respects the circuit of FIG. 2 is like the circuit of FIG. 1 and the same numerals are used to designate corresponding parts in the two figures. In FIG. 2, there is provided a transformer 41 having a primary winding 42 connected to an alternating-current supply source 16 and two secondary windings 43 and 44, the winding 44 having a mid-tap 45. Winding 43 is connected to the input terminals of a bridge rectifier 46 having positive and negative output terminals 47 and 48, respectively, across which a condenser 49 is connected. The end terminals of winding 44 are connected to the input terminals of a bridge rectifier 56 having positive and negative output terminals 50 and 51, respectively. Condensers 52 and 53 in series are connected across the output terminals 50 and 51. The center tap 45 of transformer winding 44 is connected to the common terminal of condensers 52 and 53. The positive terminal of condenser 49 is conductively connected to the negative terminal of condenser 53 to form a common terminal which is connected through a rectifying or asymmetrically conducting element 54 to the positive load terminal 25. The negative load terminals 26 is connected through a fuse 55 or other current responsive circuit interrupter to the negative terminal of condenser 49.

It will be noted that a voltage equal to the sum of the voltage across condenser 49 and the voltage across condenser 53 is impressed upon a circuit comprising the emitter-collector path of transistor 11, the load 12 and the fuse 55, all in series. The voltage across condenser 49 is impressed upon a circuit comprising rectifying element 54, poled so that current flows through it in the forward or low resistance direction, the load 12, and the fuse 55, all in series. The voltage across the load terminals 25, 26 is substantially equal to the sum of the voltages across condensers 49 and 53, respectively, minus the voltage drop across the emitter-collector path of transistor 11. Since the voltage across the rectifying element 54 is relatively small when it is conducting current, the maximum voltage appearing across the emitter-collector path of transistor 11 when its resistance is high is no greater than the voltage across condenser 53. The voltage across condenser 53 is chosen so that this voltage across the emitter-collector path of transistor 11 will not damage the transistor. If desired, the voltage across condenser 49 may be considerably larger than the voltage across condenser 53. A voltage equal to the sum of the voltages across condensers 49, 53 and 52 is applied to a circuit comprising resistor 36, the collector-emitter path of transistor 35, and resistors 32 and 33, all in series, and is also applied to a circuit comprising resistor 39, the emitter-collector path of transistor 38, resistor 40, and load 12, all in series.

The circuit functions like the circuit of FIG. 1 to minimize load voltage changes during normal operation. When the load voltage decreases by a small amount, for example, the control voltage equal to the difference of the substantially constant reference voltage across the diode 31 and a portion of the load voltage increases. This control voltage applied to the emitter-base circuit of transistor 35 causes a reduction of the resistance of the emitter-collector path of transistor 11 with a resulting decrease of voltage drop across the emitter-collector path of transistor 11. The assumed decrease of load voltage is thus minimized. If the load should suddenly increase due to an accidental short circuit across the load terminals, for example, the voltage across the diode 31 will decrease at a faster rate than the voltage across the load. The control voltage equal to the difference of the voltage across the diode 31 and a portion of the load voltage therefore decreases rapidly from a voltage of one polarity, through zero to a voltage of opposite polarity to cause the resistance of the emitter-collector path of transistor 11 to increase thereby preventing damage to the transistor due to excessive current flow therethrough. Damage to the transistor due to excessive voltage across its emitter-collector path is prevented by employing the two voltage sources across condensers 49 and 53 connected in series aiding relationship for energizing the load circuit and providing a rectifying element 54 in a path connecting the common terminal of condensers 49 and 53 to the collector of transistor 11 to thereby limit the maximum voltage drop across the emitter-collector path of the transistor. Under the short-circuited load condition, the rectifying element passes a current sufficiently high to blow the fuse 55 or to open a quick-acting circuit breaker which could be used in place of the fuse. It should be noted that the fuse or circuit breaker would not open the circuit quickly enough to prevent damage to the transistor 11. The control circuit responds much faster to a sudden increase of load to prevent excessive current flow through the transistor 11.

It will be noted that current flows into the emitter and out of the base and collector electrodes of p-n-p type transistor 11 while, in the case of n-p-n type transistor 35, current flows into the collector and out of the base and emitter electrodes. As the terms are used herein, emitter-base current, base-emitter current, emitter-collector current and collector-emitter current may refer to the currents flowing in either the p-n-p or the n-p-n type transistor.

What is claimed is:

1. Apparatus for supplying current from a direct-current source to a load circuit including a load comprising a transistor having an emitter, a collector and a base, means for supplying current through the emitter-collector path of said transistor to said load, a p-n junction diode, a current path comprising said diode connected across said load circuit for nomally maintaining a substantially constant voltage across said diode, means responsive to a voltage equal to the difference of the voltage across said diode and a portion of the load voltage for controlling the emitter-collector resistance of said transistor to normally maintain the load voltage substantially constant, and means responsive to a sudden abnormally large increase of load for causing the voltage across said diode to decrease at a faster rate than the rate of decrease of the load voltage resulting from said increase of load, thereby causing the resistance of said emitter-collector path to increase and the current through said emitter-collector path to decrease.

2. Apparatus for supplying current from a direct-current source to a load comprising a transistor having an emitter-collector path connected in series with said source and said load, a p-n junction diode, a current path comprising said diode connected across said load for normally maintaining a substantially constant reference voltage across said diode, means comprising said diode for causing the resistance of said emitter-collector path to decrease in response to a decrease of load voltage to normally maintain said load voltage substantially constant, and means responsive to a decrease of load voltage resulting from an abnormal increase of load for causing the resistance of said emitter-collector path to increase, said last-mentioned means comprising means for causing the voltage across said diode to decrease at a faster rate than the rate of decrease of the load voltage.

3. Apparatus for supplying to a load circuit including a load current from a direct-current supply source comprising a transistor having an emitter-collector path in series with said supply source and said load, and means for deriving from said load circuit a voltage for controlling the resistance of said emitter-collector path, said means comprising means for deriving a component voltage which is substantially constant in normal operation to cause load voltage changes to be minimized and which component voltage decreases faster than the load voltage when the load resistance is abruptly decreased to cause the resistance of said emitter-collector path to increase and thereby limit the current in the load circuit.

4. Apparatus for supplying to a load circuit including a load current from a direct-current supply source comprising a transistor having an emitter-collector path in series with said current source and said load, a p-n junction diode, and means comprising said diode for deriving from said load circuit a voltage for controlling the resistance of said emitter-collector path, said means comprising means for supplying current from said load circuit to said diode to maintain the voltage across said diode substantially constant during normal operation and to cause the voltage across said diode to decrease in response to an abnormal sudden decrease of load voltage at a faster rate than the rate of decrease of said load voltage to thereby protect said transistor from damage due to excessive current flow through said emitter-collector path.

5. Apparatus for controlling current supplied from a direct-current supply source to a load circuit including a load comprising a p-n junction diode, means for energizing said diode by current from said load circuit, means for deriving a control voltage equal to the difference of the voltage across said diode and a portion of the load voltage, the voltage across said diode normally being larger than said portion of the load voltage, and means responsive to an abnormally large abrupt decrease of load voltage for causing a polarity reversal of said control voltage.

6. Apparatus for controlling current supplied from a direct-current supply source to a load circuit including a load comprising a p-n junction diode, means for normally supplying current from said load circuit through said diode in the reverse direction to set up across said diode a substantially constant voltage, means for deriving from said load circuit a control voltage equal to the difference of the voltage across said diode and a portion of the load voltage which is less than said constant voltage under a normal operating condition, and means responsive to an abnormally large abrupt decrease of load voltage for causing current from said load circuit to be supplied through said diode in the forward direction to thereby cause a reversal of the polarity of said control voltage.

7. In combination, a transistor having an emitter, a collector and a base, means for supplying current from a direct-current supply source through the emitter-collector path of said transistor to a load, a resistance path connected across said load, a p-n junction diode, resistance means, a current path connected across said load comprising said diode and said resistance means in series, said diode being poled to cause current flow therethrough normally in the reverse direction to thereby set up a substantially constant voltage across said diode, a transistor amplifier having an input upon which a control voltage may be impressed for controlling the emitter-base current of said transistor, means for impressing upon said input a control voltage equal to the difference of a first voltage across said diode and a second voltage across a portion of the resistance of said resistance path, said first voltage normally being larger than said second voltage, and a condenser connected across a portion at least of said resistance means for causing a reversal of the current flowing through said diode in response to an abrupt large decrease of load voltage.

8. In combination, a first and a second rectifier each having a positive and a negative output terminal, an asymmetrically conducting element, means for supplying current from said first rectifier to a first circuit comprising said asymmetrically conducting element in its forward or low resistance direction and a load in series, a transistor having an emitter, a collector and a base electrode, means for supplying current from said second rectifier to a second circuit comprising the emitter-collector path of said transistor and said load in series, said asymmetrically conducting element being in a path connecting the positive terminal of said first rectifier and the negative terminal of said second rectifier to one of said emitter and collector electrodes, a resistance path connected across said load, a p-n junction diode, resistance means, a current path connected across said load comprising said diode and said resistance means in series, said diode being poled to cause current flow therethrough normally in the reverse direction to thereby set up a substantially constant voltage across said diode, a transistor amplifier having an input upon which a control voltage may be impressed for controlling the emitter-base current of said transistor, means for connecting the common terminal of said diode and said resistance means to one of the input terminals of said amplifier, means for connecting a terminal of said resistance path intermediate its end terminals to the other of said amplifier input terminals, and a condenser connected across a portion at least of said resistance means.

9. In combination, a first and a second source of direct voltage each having a positive and a negative terminal, means for connecting the positive terminal of said first source to the negative terminal of said second source to form a common terminal, a transistor having emitter, collector and base electrodes, a circuit comprising said first and second voltage sources, the emitter-collector path of said transistor and a load all in series, means for controlling the resistance of said emitter-collector path comprising means for causing said resistance to decrease in response to a normal decrease of load voltage to normally minimize said decrease of load voltage and for causing said resistance to increase in response to an abnormally large abrupt decrease of load voltage to limit the current in said emitter-collector path, and means for preventing excessive voltage across said emitter and collector electrodes comprising an asymmetrically conducting element in a current path connecting said common terminal to one of said emitter and collector electrodes which is electrically nearer to a load terminal than to a terminal of said voltage sources.

10. In combination, a first, a second and a third voltage source each having a positive and a negative terminal, means for conductively connecting the positive terminal of said first source to the negative terminal of said second source, means for conductively connecting the positive terminal of said second source to the negative terminal of said third source, a first transistor of the p-n-p type having an emitter, a collector and a base, means for connecting the positive terminal of said second source to the emitter of said first transistor, means for connecting the collector of said first transistor to the positive terminal of a load, means comprising an asymmetrically conducting element for connecting the positive terminal of said first source to said positive load terminal, said element being poled to conduct current in its forward or low resistance direction, means comprising a current responsive circuit interrupting device for connecting the negative load terminal to the negative terminal of said first source, a voltage dividing resistance path connected across said load and having a terminal intermediate its end terminals, a second transistor of the n-p-n type having an emitter, a collector and a base, means for connecting said intermediate terminal to the base of said second transistor, a p-n junction diode, resistance means, a shunt path across said load comprising said diode and said resistance means in series, said diode being poled so that current flowing out of the collector of said first transistor flows into the n region and out of the p region of said diode and thence through said resistance means to the negative terminal of said first source, a condenser connected across a portion at least of said resistance means, means for connecting the common terminal of said diode and said resistance means to the emitter of said second transistor, a third transistor of the p-n-p type having an emitter, a collector and a base, means for conductively connecting the collector of said second transistor to the base of said third transistor, means for conductively connecting the emitter of said third transistor to the base of said first transistor, means for connecting the collector of said third transistor to said positive load terminal, a first and a second resistor each having a first terminal connected to the positive terminal of said third source and a second terminal, means for connecting the second terminal of said first resistor to the collector and base of said second and third transistors respectively, and means for connecting the second terminal of said second resistor to the base and emitter of said first and third transistors respectively.

References Cited in the file of this patent

UNITED STATES PATENTS 2,832,900 Ford ---------------- Apr. 29, 1958